United States Patent [19]
Kohav et al.

[11] Patent Number: 6,084,213
[45] Date of Patent: Jul. 4, 2000

[54] METHOD AND APPARATUS FOR INCREASING TEMPERATURE UNIFORMITY OF HEATED WAFERS

[75] Inventors: Gil Kohav, Kiryat Tivon; Igor Fidelman, Nesher; Arie Harnik, Haifa, all of Israel

[73] Assignee: Steag C.V.D. Sytems, Ltd., Migdal Ha'Emek, Israel

[21] Appl. No.: 09/080,402

[22] Filed: May 18, 1998

[51] Int. Cl.[7] .................................................. H01L 21/20
[52] U.S. Cl. ........................ 219/390; 219/405; 392/418; 118/725
[58] Field of Search ..................... 219/390, 405, 219/411; 392/416, 418; 118/724, 725, 728, 730, 50.1

[56] References Cited

U.S. PATENT DOCUMENTS

| | | | |
|---|---|---|---|
| 4,560,420 | 12/1985 | Lord | 438/795 |
| 4,755,654 | 7/1988 | Crowley et al. | 219/405 |
| 4,958,061 | 9/1990 | Wakabayashi et al. | 219/411 |
| 5,781,693 | 7/1998 | Ballance et al. | 392/416 |

FOREIGN PATENT DOCUMENTS

| | | |
|---|---|---|
| 62-98613 | 5/1987 | Japan . |
| 5-102077 | 4/1993 | Japan . |
| 8-139047 | 5/1996 | Japan . |

*Primary Examiner*—John A. Jeffery
*Attorney, Agent, or Firm*—Foley & Lardner

[57] ABSTRACT

A method and apparatus are described for increasing the temperature uniformity of a wafer heated in a rapid thermal process (RTP) while the wafer is supported by a high emissivity structure in spaced relation above the head during the heating of the wafer; characterized in that a high-reflectivity ring, highly reflective to the radiation of the wafer, is provided on the head underlying the high emissivity ring.

26 Claims, 6 Drawing Sheets

METHOD AND APPARATUS FOR INCREASING TEMPERATURE UNIFORMITY OF HEATED WAFERS

FIELD OF THE INVENTION

The present invention relates to the thermal processing of wafers, and particularly to a method and apparatus for increasing the temperature uniformity of a wafer during the thermal processing of the wafer.

BACKGROUND OF THE INVENTION

The thermal processing of semiconductor wafers generally involves a number of heating steps in which the temperature is a critical parameter. One of the major problems in the thermal processing of wafers is to maintain temperature uniformity over the complete wafer since temperature non-uniformity affects not only the proper thermal processing of the wafer, but also the proper measurement of the wafer temperature since the temperature is usually measured at the wafer center. This problem is particularly acute in Rapid Thermal Processes (RTP) frequently used to reduce the wafer heating time. In RTP, the wafer is heated by lamps, typically tungsten-halogen lamps, at a very high heating rate, e.g. approaching or exceeding 100° C./sec. Such a high heating rate is to be sharply contrasted with the 1–2° C./min in regular furnaces which heats the wafer by gas, or 10–50° C./min in mini-furnaces. Non-uniformity is an inherent problem of RTP because of: (1) the temperature differences between the wafer and other parts of the reactor which are not heated; and (2) the fast heating which does not provide sufficient time to equalize temperatures.

A major cause for temperature non-uniformity is due to the heat losses at the outer edge of the wafer. Thus, the wafer is generally supported on a head in the heating chamber via a rim and a high emissivity ring for blocking stray radiation from the heater which might influence measurements of the wafer temperature. The rim radiates a substantial amount of heat from its side, and also conducts heat via the high emissivity ring to the head. As a result, the wafer edge becomes cooler than the center.

One method to solve the problem is to vary the power of the heater as a function of the wafer radius, i.e., to concentrate more heat from the heater on to the outer edge of the wafer. However, this method of reducing temperature non-uniformity is very limited because of the difficulty in focusing more heat on the outer edges of the wafer than at the center.

SUMMARY AND OBJECT OF THE INVENTION

An object of the present invention is to provide a novel method of increasing the temperature uniformity of a wafer while it is being heated and/or kept at an elevated temperature, particularly in RTP of wafers. Another object of the invention is to provide heating apparatus for heating a wafer in such a manner as to increase the temperature uniformity of the wafer while it is being heated and/or kept at an elevated temperature.

According to one aspect of the present invention, there is provided a method of increasing the temperature uniformity of a wafer heated by a heater while the wafer is supported on a head via a rim on the head and a high emissivity ring on the rim for blocking stray radiations from the heater which influence measurements of the wafer temperature, said high emissivity ring being supported on its outer edge by the rim, and supporting on its inner edge the wafer in spaced relation above the head during the heating of the wafer; characterized in that a high-reflectivity ring, highly reflective to the radiation of the wafer, is provided on said head spaced below said high emissivity ring aligned with said high emissivity ring, and enclosed by said rim.

According to further features in the described preferred embodiments, the high reflectivity ring reflects at least 50%, preferably at least 80%, of the radiation of the wafer. Data set forth below show particularly good results in maintaining temperature uniformity when the high reflectivity ring reflects 80% of the radiation of the wafer.

According to further features in the described preferred embodiments, the high reflectivity ring may be a pre-formed ring secured to the head by fasteners, or a pre-formed ring secured to the head by welding, or a reflecting metal coating applied to the head. The high reflectivity ring should be highly reflective to the dominant wave lengths of the wafer radiation at wafer heating temperatures, e.g. 2–8 $\mu$m, as will be shown below. As will also be shown below, particularly good results are obtainable when the rim is of thermally insulating material.

According to another aspect of the present invention, there is provided heating apparatus for heating a wafer including a heating chamber, comprising: a head for supporting a wafer to be heated; a heater for heating a wafer when supported on said head; a wafer temperature measuring device; a high emissivity ring supporting, the wafer; in spaced relation above the head during the heating of the wafer; and a high reflectivity ring, highly reflective to the radiation of the wafer, supported on the head underlying the high emissivity ring.

Further features and advantages of the invention will be apparent from the description below.

BRIEF DESCRIPTION OF THE DRAWINGS

The invention is herein described, by way of example only, with reference to the accompanying drawings, wherein.

THE PRIOR ART

Figure 1:
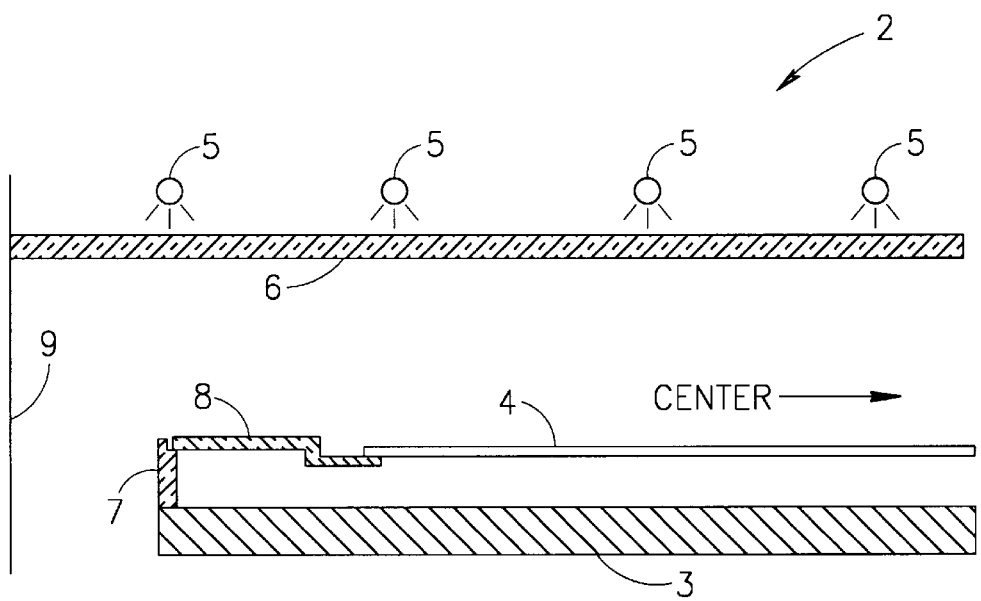
FIG. 1 schematically illustrates a prior art apparatus for heating a wafer.

FIG. 1 schematically illustrates heating apparatus in accordance with the prior art for heating semiconductor wafers. The apparatus illustrated in FIG. 1 includes a cylindrical heating chamber, generally designated 2, having a head 3 for supporting a wafer 4 to be heated. The heating means includes a plurality of halogen lamps 5 at the upper end of the heating chamber 2 and separated from the wafer 4 by a quartz window 6 connected to the cylindrical wall 9 of chamber 2. The wafer 4 to be heated is supported on head 3 by means of a rim 7 and a high emissivity ring 8 which, together, block stray radiations from the heater that influence the measurements of temperature, generally made by a pyrometer (not shown). The rim 7 is supported on the outer periphery of the head 3 and, in turn, supports the outer edge of the high emissivity ring 8 while the inner edge of ring 8 supports the wafer 4.

As indicated earlier, a significant amount of heat is lost by radiation from the rim 7, or by conduction from the rim to the head 3, particularly if the head is cooled. Ring 8, preferably a slip free ring (SFR), absorbs heat from the wafer edge, and as a result, the wafer edge becomes cooler than the center.

Figure 2:
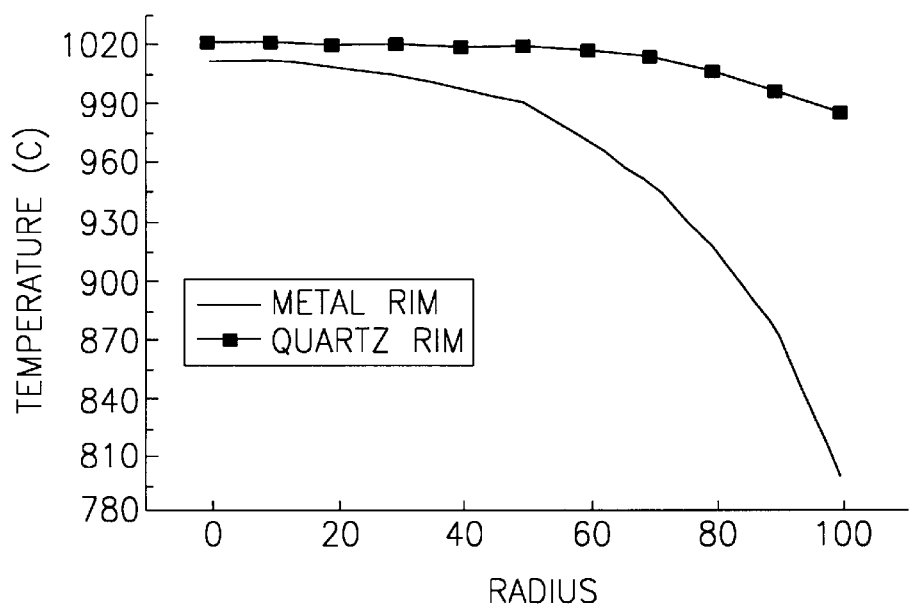
FIG. 2 illustrates how the temperature of the wafer varies with the radius when using the prior art heating apparatus of FIG. 1.

FIG. 2 illustrates the simulated temperature distribution on the wafer, under steady state conditions (temperature constant for the process), in such a prior art apparatus having uniform heating and a low pressure, for a rim made of metal and of quartz, respectively. As shown in FIG. 2, where the rim 7 is a metal, there is a very substantial difference in temperature between the center and the outer edge; this difference is substantially reduced, but even then is significant, when the rim is of quartz.

Figure 3:
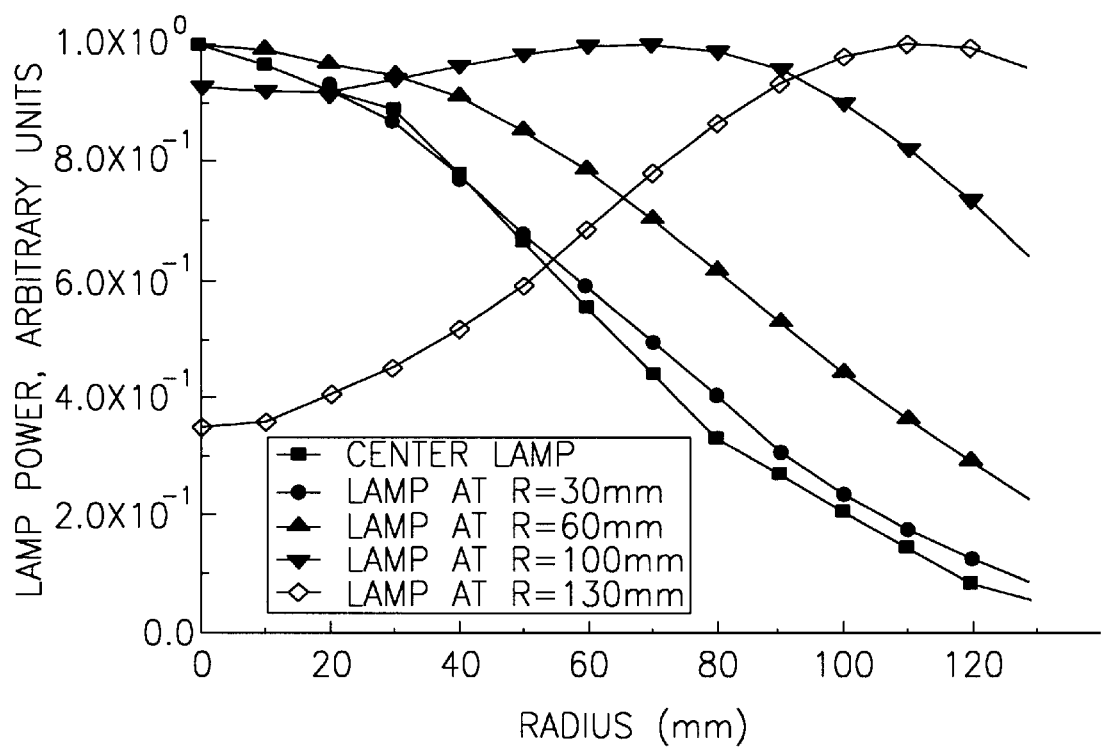
FIG. 3 illustrates typical heating lamp power as a function of the wafer radius when using the prior art heating apparatus of FIG. 1.

As indicated earlier, one prior art method of solving the problem of non-uniformity in the temperature of the wafer is to vary the power of the heating lamps as a function of the radius. However, as also indicated earlier, this solution is very limited because of the difficulty in providing the required non-uniform heat distribution by the heating lamps. FIG. 3 shows typical powers of lamps located at different distances from the center and how the lamp power varies with the radius of the wafer. For example, if one tries to heat the high emissivity ring 8 by increasing the power of the lamp located 130 mm from the center, it will be seen from FIG. 3 that such an increase in power in the lamp will influence even the center of the wafer.

DESCRIPTION OF THE PRESENT INVENTION

Figure 4:
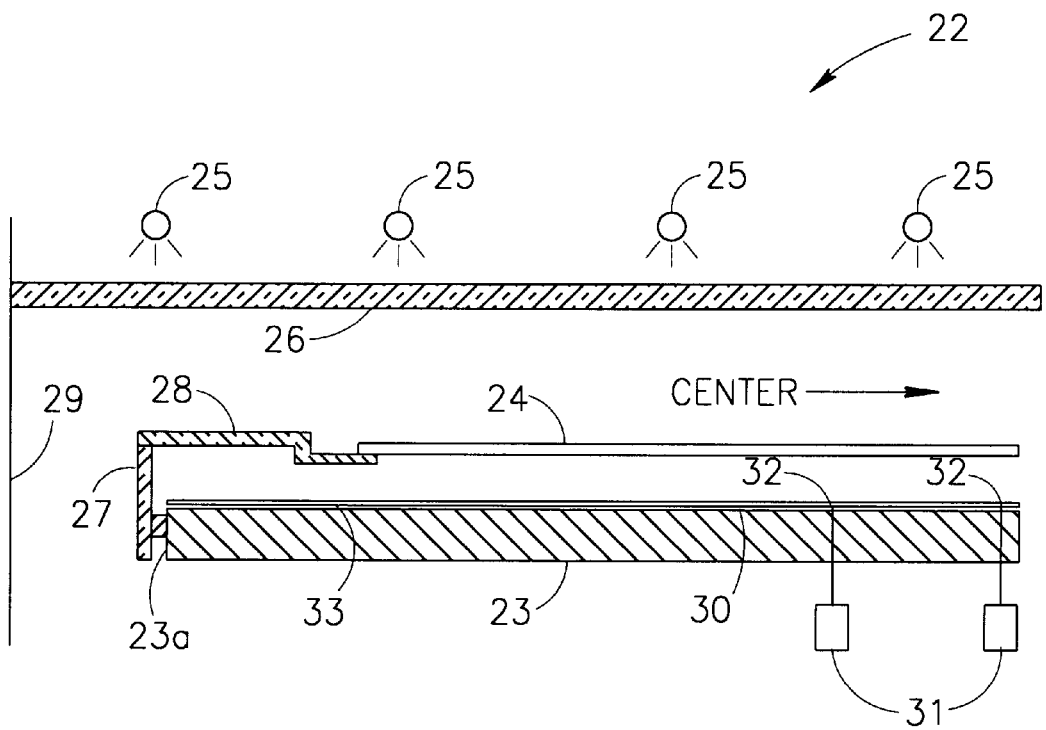
FIG. 4 schematically illustrates a heating apparatus constructed in accordance with the present invention for heating wafers in a manner to increase the temperature uniformity thereof.

FIG. 4 schematically illustrates one form of apparatus constructed in accordance with the present invention for increasing the temperature uniformity of the heated wafer. The apparatus illustrated in FIG. 4 includes a cylindrical heating chamber, generally designated 22, containing a head 23 for heating a wafer 24 supported by the head within the heating chamber.

The heater in FIG. 4 also includes a plurality of halogen lamps 25 separated from the wafer 24 by a quartz window 26 connected to cylindrical wall 29 of chamber 22. The wafer 24 is also supported by a rim 27 circumscribing the head 23, and a high emissivity ring 28 whose outer end rests on the rim 27, and whose inner end supports the wafer 24. Head 23 may rotate to rotate wafer 24, and may be cooled by a circulating fluid (liquid or gas). A significant amount of heat is lost by radiation from the rim side, or by conduction to the head, especially if the head is cooled. The rim 27 absorbs heat from the high emissivity ring 28, which in turn absorbs it from the edge of the wafer 24. As a result, the wafer edge becomes colder than the sensor.

In the apparatus illustrated in FIG. 4, a parallel plate 30 is supported on head 23 and has a diameter slightly larger than the diameter of the wafer 24. Plate 30 is thus supported below, and parallel to, the wafer 24, with the center of the plate (not shown) on the same axis as the wafer central axis. Parallel plate 30 increases the amount of radiation reflected from the wafer 24 in order to more accurately calculate the temperature measurement. Thus, parallel plate 30 reduces the difference in the radiation from wafers having different emissivities. The radiation is used by the pyrometers 31 for measuring the temperature of the wafer 24. One or more pyrometers 31 are used for measuring the temperature of the wafer, and for this purpose, parallel plate 30 is formed with an opening for each pyrometer for receiving the end of an optical fiber 32 leading to the respective pyrometer.

Figure 6:
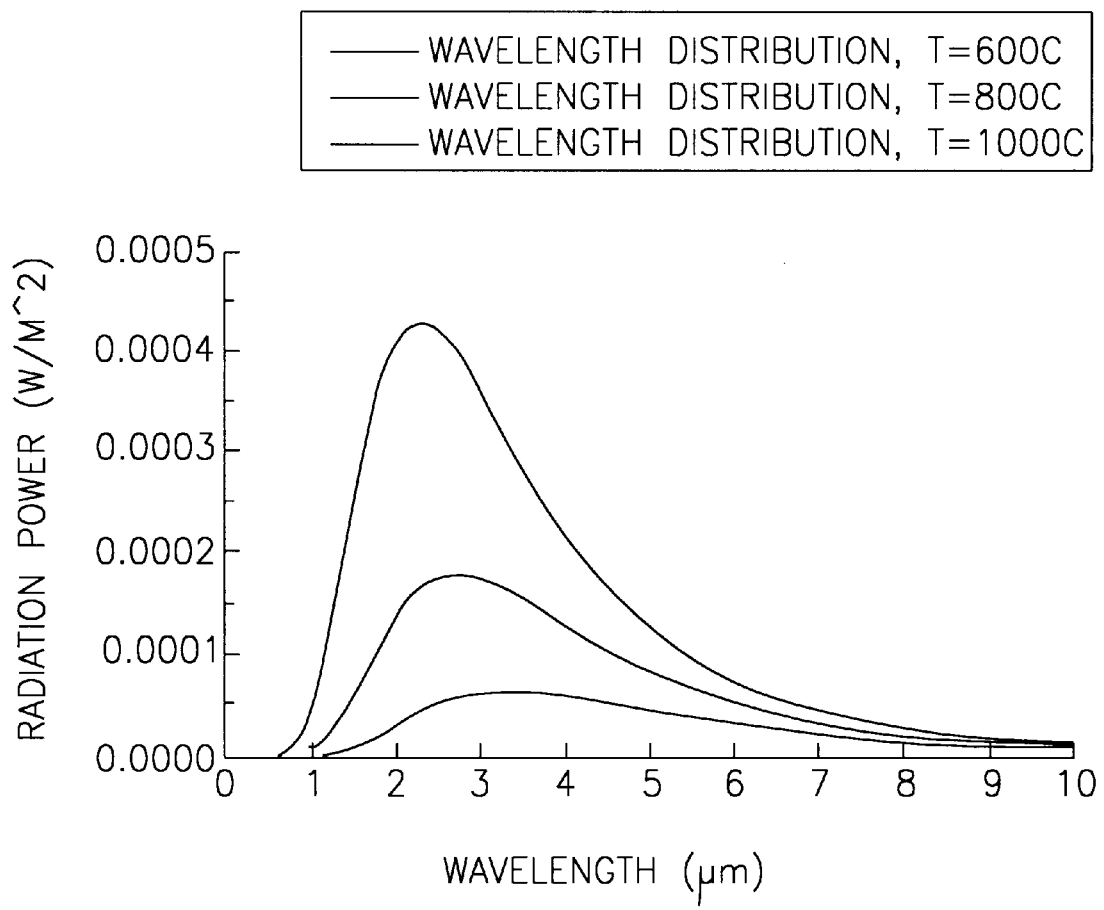
FIG. 6 illustrates a typical wavelength distribution when heating a wafer in the apparatus of FIG. 4.

The apparatus illustrated in FIG. 4 further includes a high reflectivity ring 33 aligned with, but spaced below, the high emissivity ring 28 and enclosed by the rim 27. Ring 33 has a high reflectivity to the radiation of the heated wafer 24, i.e. to the dominant wavelength of the radiation produced by the wafer at the wafer temperature. FIG. 6 illustrates a typical wavelength distribution for three heating temperatures (600° C., 800° C. and 1000° C.) from which it will be seen that the dominant wavelengths are 2–8 $\mu$m.

Figure 5A:
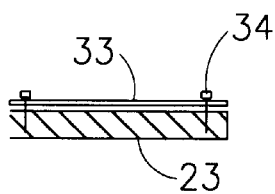
FIGS. 5a, 5b and 5c diagramatically illustrate various ways of securing the high reflectivity ring to the head in the heating apparatus of FIG. 4.
Figure 5B:
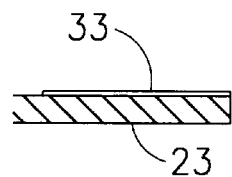
Figure 5C:
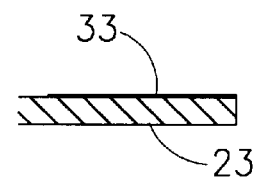

High reflectivity ring 33 may be secured to the outer periphery of head 23 in any suitable manner. FIGS. 5a–5c illustrate three examples, wherein the high reflectivity ring 33 is secured to head 23 by fasteners 34 (FIG. 5a), by welding (FIG. 5b), or by being applied as a reflective coating on the head (FIG. 5c).

Parallel plate 30 may be also be secured to the central region of head 23 in any one of the above-described manners illustrated in FIGS. 5a–5c for securing the high reflectivity ring 33 to the head.

Rim 27 functions, together with the high emissivity ring 28, to block stray radiation. Rim 27 is of low thermal conductivity, for example of quartz, and is made as thin as possible to reduce heat conductivity to the head 23.

In the prior art construction illustrated in FIG. 1, the rim 7 rests on the outer circumference of the head 3, and the high emissivity ring 8 rests on the inner edge of the rim. FIG. 4 illustrates an improved construction, wherein the rim 27 is supported on an annular step 23a formed in the outer circumference of the head 23. In addition, the high emissivity ring 28 is extended so that its outer edge covers the rim 27. Such an arrangement increases the effective surfaces of both the rim 27 and the ring 28 to reduce heat transfer and block stray radiations from the heater which might influence measurements of the wafer temperature.

Figure 7:
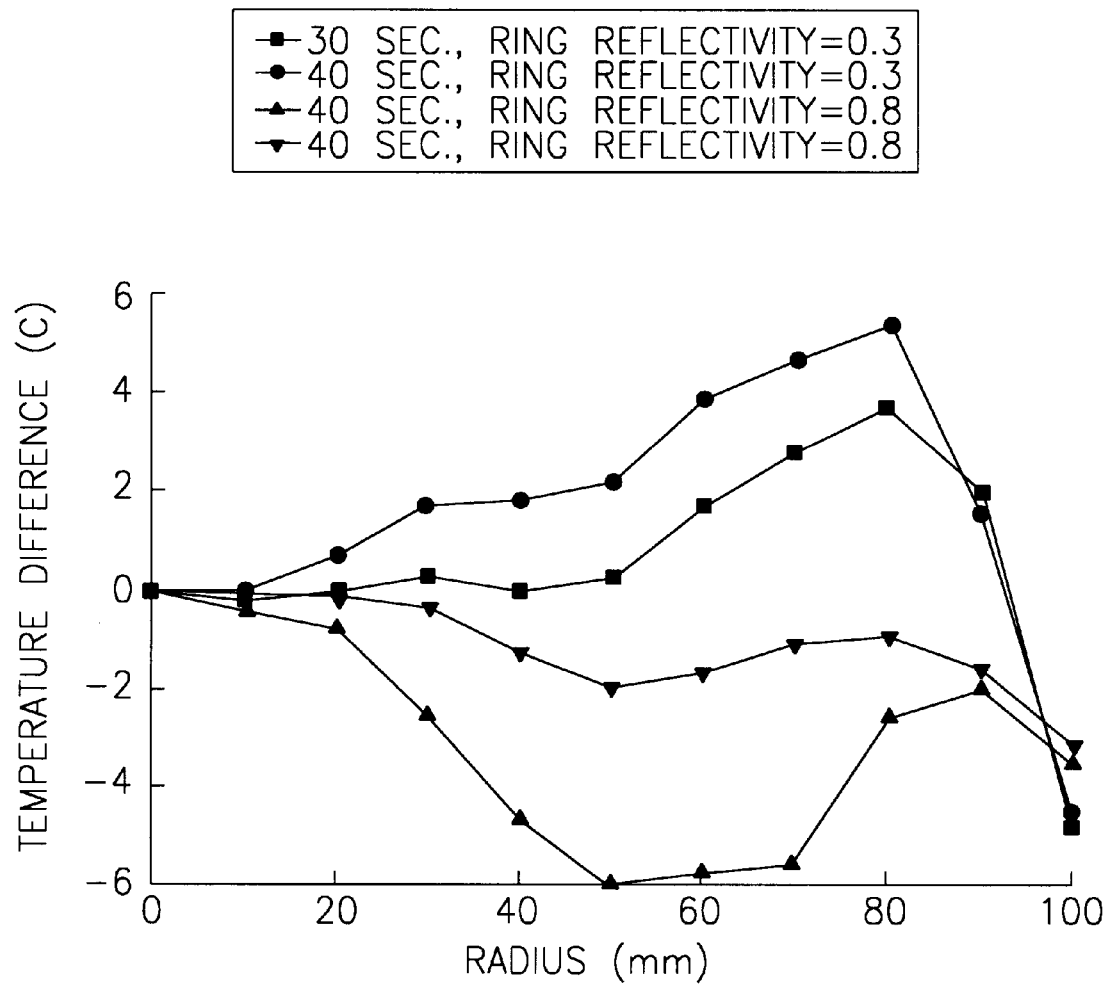
FIG. 7 illustrates the wafer temperature at three different points on the wafer when not using a high reflectivity ring in accordance with the apparatus of FIG. 4 when the head has a reflectivity of 0.3 and 0.9, respectively.
Figure 8:
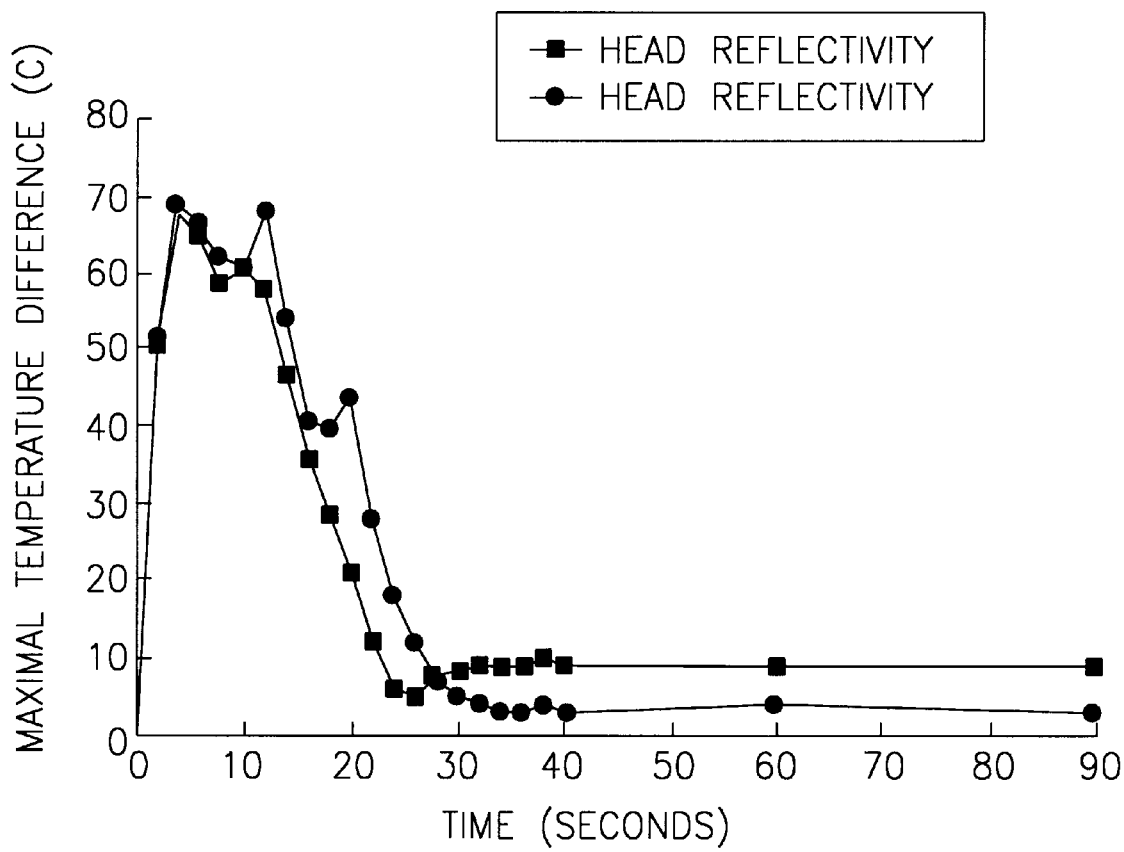
FIG. 8 illustrates the temperature difference between the hotter and the colder points on the heated wafer when heated according to the conditions of FIG. 7.

FIG. 7 illustrates, by computer simulation, the temperature difference between the center and other radial points on the wafer, when not using the high reflectivity ring 33 (head reflectivity equal 0.3) and when using the high reflectivity ring 33 (head reflectivity equal 0.8). FIG. 8 illustrates the temperature difference between the hotter points to the colder points on the wafer, as a function of time, with and without the highly reflective ring 33 (i.e. head reflectivity equal 0.3 and 0.8, respectively). The latter figure shows that the wafer temperature without the highly reflective ring 33 increases to its highest level 20 mm from the edge, then falls sharply. The reason for this phenomenon is the low temperature of the high emissivity ring 28, which cools the wafer edge. Thus, the temperature of the high emissivity ring 28, without the highly reflective ring 33 under it, reaches a temperature which is lower by approximately 30° C. than when the highly reflective ring 33 is provided.

In these examples, the rim 27 is of low conductivity (e.g. of quartz). The low thermal conductivity of the rim causes the high emissivity ring 28 to lose heat mainly by radiation from its edge to the chamber wall, and not by conduction to the cold head 23. Therefore, the temperature of the rim is lower only by a few degrees than the temperature of the high emissivity ring 28.

While the invention has been described with respect to one preferred embodiment, it will be appreciated that this is set forth merely for purposes of example, and that many other variations, modifications and applications of the invention may be made.

We claim:

1. A method for obtaining a uniform temperature across a section of a wafer, said wafer being heated by a radiation emitting element, the method comprising the steps of:

supporting an edge of the wafer on a high emissivity ring; and supporting a reflective ring below said high emissivity ring, said reflective ring reflecting radiation onto said high emissivity ring, thereby increasing the temperature at the supported edge of said wafer.

2. The method according to claim 1, wherein said reflective ring reflects at least 50% of the radiation of the wafer.

3. The method according to claim 2, wherein said reflective ring reflects at least 80% of the radiation of the wafer.

4. The method according to claim 1, wherein said reflective ring is a pre-formed ring secured to the head by fasteners.

5. The method according to claim 1, wherein said reflective ring is a pre-formed ring secured to the head by welding.

6. The method according to claim 1, wherein said reflective ring is a reflective metal coating applied to said head.

7. The method according to claim 1, wherein said reflective ring is highly reflective to the dominant wavelengths of the radiation of the wafer at the wafer heating temperature.

8. The method according to claim 1, wherein the reflective ring is highly reflective to wavelengths of 2–8 $\mu$m.

9. The method according to claim 1, wherein the temperature of the wafer is measured by a pyrometer passing through a reflector plate supported on a head parallel to and spaced below said wafer.

10. The method according to claim 1, wherein said high-emissivity ring is supported on a rim circumscribing a head for blocking stray radiations from radiation emitting elements which may influence measurements of the wafer temperature.

11. The method according to claim 10, wherein said rim is supported on an annular step formed in the outer circumference of said head.

12. The method according to claim 10, wherein said rim is of thermally insulating material.

13. The method according to claim 1, wherein the reflective ring is supported below the high emissivity ring such that the reflective ring does not overlap the edge of the wafer.

14. Heating apparatus for obtaining a uniform temperature across a section of a wafer being heated by a radiation emitting element, comprising:

a high emissivity ring supporting an edge of said wafer, said high emissivity ring being supported by a rim circumscribing a head;

a wafer temperature measuring device; and a high reflectivity ring, supported on said head, the high reflectivity ring reflecting radiation onto said high emissivity ring, thereby increasing the temperature at the supported edge of said wafer.

15. The apparatus according to claim 14, wherein said high reflectivity ring reflects at least 50% of the radiation of the wafer.

16. The apparatus according to claim 14, wherein said high reflectivity ring is a pre-formed ring secured to the head by fasteners.

17. The apparatus according to claim 14, wherein said high reflectivity ring is a pre-formed ring secured to the head by welding.

18. The apparatus according to claim 14, wherein said high reflectivity ring is a reflective metal coating applied to said head.

19. The apparatus according to claim 14, wherein said high reflectivity ring is highly reflective to the dominant wave lengths of the radiation of the wafer at the wafer heating temperature.

20. The apparatus according to claim 14, wherein the high reflectivity ring is highly reflective to wavelengths of 2–8 $\mu$m.

21. The apparatus according to claim 14, wherein the temperature of the wafer is measured by a pyrometer passing through a reflector plate supported on said head parallel to and spaced below said wafer.

22. The apparatus according to claim 14, wherein said high-emissivity ring is supported on a rim circumscribing said head for blocking stray radiations from radiation emitting elements which may influence measurements of the wafer temperature.

23. The apparatus according to claim 22, wherein said rim is supported on an annular step formed in the outer circumference of said head.

24. The apparatus according to claim 22, wherein said rim is of thermally insulating material.

25. The apparatus according to claim 14, wherein radiation emitting elements are located to be above the wafer when supported on said head, and wherein a heating chamber further includes a quartz window between the radiation emitting elements and the wafer when supported on the head.

26. The apparatus according to claim 14, wherein the high reflectivity ring is supported on the head below the high emissivity ring such that the reflective ring does not overlap the edge of the wafer.

* * * * *